(12) United States Patent
Kim et al.

(10) Patent No.: US 7,834,611 B2
(45) Date of Patent: Nov. 16, 2010

(54) BANDGAP REFERENCE GENERATING CIRCUIT

(75) Inventors: Kyung-Hoon Kim, Gyeonggi-do (KR);
Dae-Han Kwon, Gyeonggi-do (KR);
Taek-Sang Song, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 70 days.

(21) Appl. No.: 12/266,693

(22) Filed: Nov. 7, 2008

(65) Prior Publication Data
US 2009/0121701 A1 May 14, 2009

(30) Foreign Application Priority Data
Nov. 8, 2007 (KR) ................ 10-2007-0113662

(51) Int. Cl.
*G05F 3/16* (2006.01)
*G05F 1/10* (2006.01)
(52) U.S. Cl. ................ 323/317; 327/539
(58) Field of Classification Search ........ 323/317, 323/316; 327/539
See application file for complete search history.

(56) References Cited

U.S. PATENT DOCUMENTS

| | | | |
|---|---|---|---|
| 5,867,012 A * | 2/1999 | Tuthill ........ | 323/313 |
| 5,949,227 A | 9/1999 | Bujanos | |
| 5,955,873 A * | 9/1999 | Maccarrone et al. ...... | 323/314 |
| 6,008,685 A * | 12/1999 | Kunst .......... | 327/512 |
| 6,642,776 B1 * | 11/2003 | Micheloni et al. ....... | 327/539 |
| 6,720,755 B1 | 4/2004 | Sharpe-Geisler | |
| 7,286,002 B1 * | 10/2007 | Jackson ........ | 327/539 |
| 7,560,979 B1 * | 7/2009 | Hsu et al. ........ | 327/539 |
| 2007/0182477 A1 | 8/2007 | Kim | |
| 2007/0200616 A1 | 8/2007 | Shin | |

FOREIGN PATENT DOCUMENTS

| | | |
|---|---|---|
| JP | 2005-216040 | 8/2005 |
| KR | 10-0420083 B1 | 2/2004 |
| KR | 10-2007-0036568 A | 4/2007 |

OTHER PUBLICATIONS

Korean Office Action, with English Translation, issued in Korean Patent Application No. KR 10-2007-0113662, dated Jan. 31, 2009.
Koudounas, Savvas et al., "A Reduced-Area, Low-Power CMOS Bandgap Reference Circuit," IEEE ISCAS 2007, pp. 27-30, May 2007.
Notice of Allowance issued from Korean Intellectual Property Office on Jul. 17, 2009 with an English Translation.

* cited by examiner

*Primary Examiner*—Shawn Riley
(74) *Attorney, Agent, or Firm*—IP & T Group LLP

(57) ABSTRACT

A bandgap reference generating circuit includes an operational amplifier configured to generate a bandgap reference voltage; and a gain controller configured to control a gain of the operational amplifier with different values in a normal mode and a low power mode.

16 Claims, 2 Drawing Sheets

BW_CTRLI
(EN1/EN2)

BANDGAP REFERENCE GENERATING CIRCUIT

CROSS-REFERENCE TO RELATED APPLICATION

This application claims priority of Korean patent application number 10-2007-0113662, filed on Nov. 8, 2007, which is incorporated by reference in its entirety.

BACKGROUND OF THE INVENTION

The subject matter relates to an internal voltage generating circuit of a memory device, and more particularly, to a bandgap reference generating circuit for generating a reference voltage or current which is used inside a memory device.

Semiconductor memory devices are used in various fields. Typically, semiconductor memory devices are used to store a variety of data. Semiconductor memory devices are required to have a high capacity, a high operating speed, a small size, and a low power consumption for use in various portable devices, such as desktop computers or notebook computers.

One solution for designing a low-power semiconductor memory device is to minimize a current consumption in a core area of a memory. Memory cells, bit lines, and word lines are provided in the core area, and the core area is designed according to an ultra-fine design rule. Therefore, a power supply voltage should be reduced in order to design an ultra-fine semiconductor memory device that performs a high frequency operation. At present, a power supply voltage lower than 1.5 V is used.

Using an external power supply voltage, the semiconductor device generates various levels of internal voltages. In particular, a semiconductor memory device such as a DRAM generates a core voltage (VCORE), which is used in a core area, a high voltage (VPP), which is higher than the external power supply voltage (VDD) and applied to a gate of a cell transistor, that is, a word line, and a back bias voltage (VBB), which is lower than a ground voltage (VSS) and used for a bulk of a cell transistor.

In order to generate the above internal voltages, a charge-pumping scheme (for VBB and VPP) and a down-converting scheme (for VCORE) are conventionally used. Alternatively, an internal reference voltage (VREF) is primarily generated and then internal voltages (VBB, VPP, VCORE) are secondarily generated using the internal reference voltage (VREF).

The internal reference voltage should have a constant level at a low operating voltage, regardless of process, voltage and temperature (PVT) variations.

In the semiconductor device, a conventional bandgap reference generating circuit for generating an internal reference voltage generates an internal reference voltage that satisfies Zero TC by feeding back an output voltage generated using an amp. Zero TC means that an output voltage is not varied with respect to temperature change. Also, the conventional bandgap reference generating circuit increases a band width in order to improve performance of the amp. At this point, a power supply rejection ratio (PSRR) proportional to the bandwidth is also improved.

However, as the bandwidth is increased in order to improve performance of the amp, the current consumption of the amp increases, which frustrates the low power requirement and energy reduction sought in a low-power semiconductor memory device.

In a normal mode where the semiconductor memory device performs data read/write operations, the current consumption of the amp in the bandgap reference voltage generating circuit does not matter because it is several mA or less. However, in a mode requiring reduced power (a self refresh mode, a low-power mode), the current consumption generated for the increased bandwidth of the amp cannot be ignored.

SUMMARY OF THE INVENTION

Embodiments of the present invention are directed to providing a bandgap reference generating circuit which is capable of satisfying a low power requirement.

In accordance with an aspect of the present invention, there is provided a bandgap reference generating circuit, comprising an operational amplifier configured to generate a bandgap reference voltage; and a gain controller configured to control a gain of the operational amplifier with different values in a normal mode and a low power mode.

In accordance with another aspect of the present invention, there is provided a bandgap reference generating circuit, comprising an operational amplifier configured to generate a bandgap reference voltage, a gain controller configured to control a gain of the operational amplifier with different values in a normal mode and a low power mode and a compensator configured to compensate a feedback voltage of the operational amplifier with different values in the normal mode and the low power mode.

DETAILED DESCRIPTION

Hereinafter, a bandgap reference generating circuit in accordance with the present invention will be described in detail with reference to the accompanying drawings.

Figure 1:
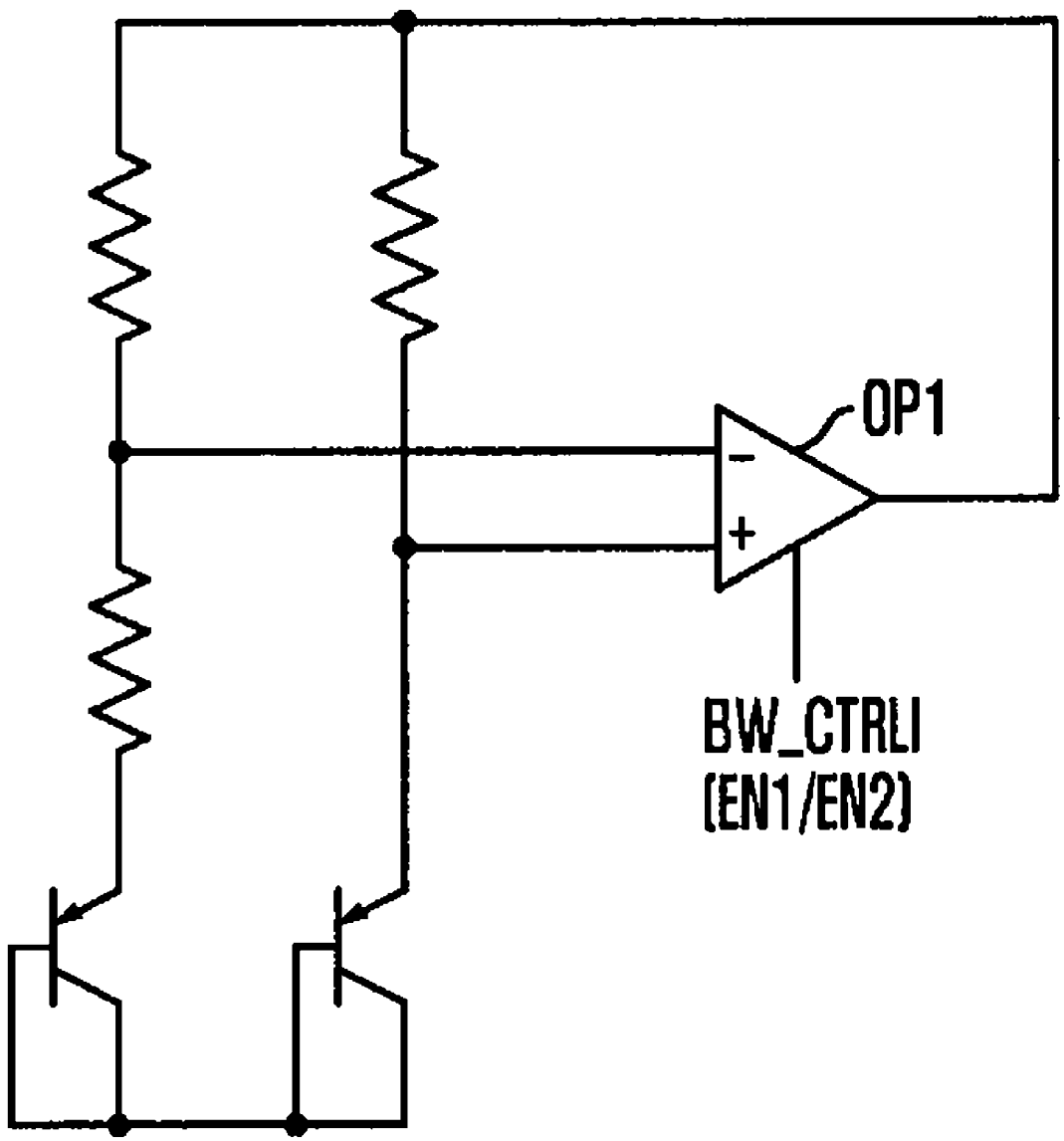
FIG. 1 is a circuit diagram illustrating a bandgap reference generating circuit in accordance with an embodiment of the present invention.

FIG. 1 is a circuit diagram illustrating a bandgap reference generating circuit in accordance with an embodiment of the present invention.

Referring to FIG. 1, the bandgap reference generating circuit includes an operational amplifier (hereinafter, referred to as an OP amp) OP1. The bandgap reference generating circuit is configured to control a bandwidth and a PSRR by controlling an amount of current flowing through the OP amp OP1.

Relative to an amount of current flowing through the OP amp OP1 required in a normal mode where read/write operations are performed, the bandgap reference generating circuit reduces an amount of current flowing through the OP amp OP1 in a self refresh mode and a low power mode. To this end, the bandgap reference generating circuit is configured to control a current of the OP amp OP1.

By increasing an operating current of the OP amp OP1 in the normal mode, relative to that in the low power mode, the bandwidth is increased while increasing the gain of the amp, thereby improving the PSRR. In this mode, the bandwidth is increased and the power noise is effectively removed.

In addition, the operating current of the OP amp OP1 in the low power mode is relatively decreased, compared with that in the normal mode. Since the operating current of the OP amp OP1 greatly influences the power consumption, minimizing the operation current of the OP amp OP1 should be satisfied most preferentially.

Figure 2:
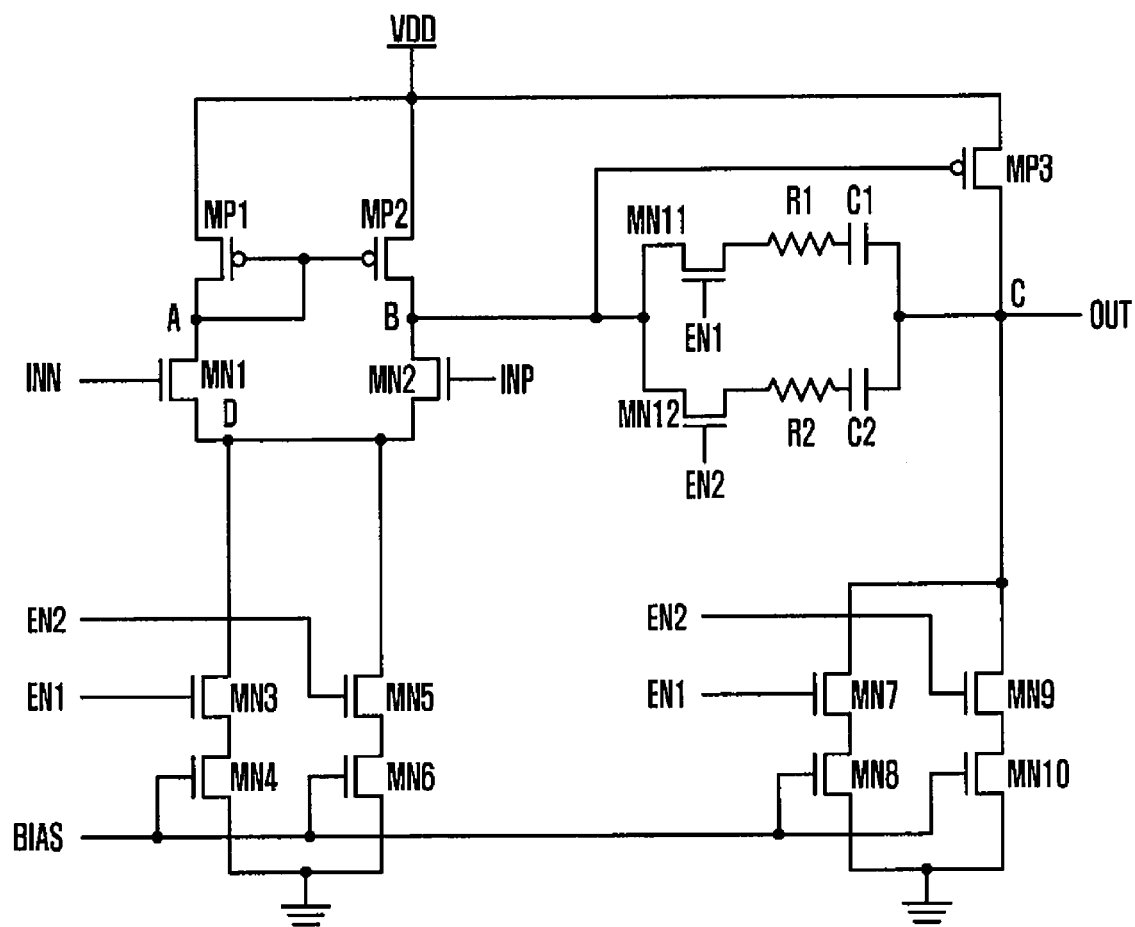
FIG. 2 is a detailed circuit diagram illustrating the bandgap reference generating circuit in accordance with an embodiment of the present invention.

FIG. 2 is a detailed circuit diagram illustrating the bandgap reference generating circuit in accordance with an embodiment of the present invention.

Referring to FIG. 2, the bandgap reference generating circuit includes a comparing unit for differentially comparing first and second input voltages, an amplifying unit for outputting an amplified internal reference voltage in response to an output signal of the amplification unit, and a first control switching unit for opening/closing a current path of the comparing unit. The bandgap reference generating circuit further includes a second control switching unit for opening/closing a current path of the amplifying unit in order to enabling/disabling the operation of the amplifying unit. The first and second control switching units are configured to control an amount of current of the comparing unit and the amplifying unit by using an external control signal.

The bandwidth reference generating circuit includes a first compensating unit with an RC circuit configuration connected between a gate and a drain of a PMOS transistor MP3 of the amplifying unit in order to operate at a read mode and a write mode in response to an external control signal EN1 and ensure a feedback characteristic of a two-stage amplifier.

In addition, the bandwidth reference generating circuit includes a second compensating unit with an RC circuit configuration connected between the gate and the drain of the PMOS transistor MP3 of the amplifying unit in order to operate at a self refresh mode and a low power mode in response to an external control signal EN2 and ensure a feedback characteristic of a two-stage amplifier.

The comparing unit includes two NMOS transistors MN1 and MN2 for differentially comparing the first and second input signals INN and INP, with the source terminals of the two NMOS transistors MN1 and MN2 being commonly connected to a node D. The first input voltage INN is applied to a gate of the NMOS transistor MN1, and the second input voltage INP is applied to a gate of the NMOS transistor MN2. A drain of the NMOS transistor MN1 is serially connected to a drain of a PMOS transistor MP1 through a node A, and an external power supply voltage VDD is applied to a source of the PMOS transistor MP1. A gate and a drain of the PMOS transistor MP1 are connected together. In addition, a drain of the NMOS transistor MN2 of the comparing unit is serially connected to a source of a PMOS transistor MP2 through a node B, and a gate of the PMOS transistor MP2 is connected to a gate of the PMOS transistor MP1. The external power supply voltage VDD is applied to a source of the PMOS transistor MP2. Although not shown, the first and second input signals input to the comparing unit are voltages which are produced by a voltage divider in a range between the power supply voltage VDD and the ground voltage.

The first control switching unit includes NMOS transistors MN3 and MN4 which are serially connected between the node D of the comparing unit and the ground voltage terminal and are controlled by the first control signal EN1. The first control signal EN1 is applied during the normal mode in which the semiconductor memory device performs the data read/write operations.

That is, the NMOS transistor MN3 has a drain connected to the node D, a source connected to a drain of the NMOS transistor MN4, and a gate receiving the external control signal EN1. The NMOS transistor MN4 has a source connected to the ground voltage terminal and a gate receiving a bias voltage BIAS.

In addition, the first control switching unit includes another transistor controlled by the second control signal EN2. That is, NMOS transistors MN5 and MN6 are serially connected between the node D of the comparing unit and the ground voltage terminal and controlled by the second control signal EN2. The second control signal EN2 is applied during the self refresh mode or the low power mode.

The NMOS transistor MN5 has a drain connected to the node D, a source connected to a drain of the NMOS transistor MN6, and a gate receiving the external control signal EN2. The NMOS transistor MN6 has a source connected to the ground voltage terminal and a gate receiving the bias voltage BIAS.

The bias voltage BIAS applied to the gates of the NMOS transistors MN4 and MN6 of the first control switching unit is provided as an enable signal when the operation of the comparing unit is enabled, and a disable signal when the operation of the comparing unit is stopped.

The amplifying unit includes a PMOS transistor MP3 which has a gate connected to the node B, a source connected to the external power supply voltage terminal VDD, and a drain connected to a node C. The internal reference voltage is output through the drain of the PMOS transistor MP3. The output of the amplifier is fed back through a feedback structure that includes the first and second compensating units for controlling the stability problem that may occur when the bandwidth of the amplifying unit is increased.

The first comparing unit includes an RC circuit connected between an input terminal (gate) (node B) and an output terminal (drain) (node C) of the PMOS transistor MP3. The RC circuit includes a resistor R1 and a capacitor C1. The operation of the first compensating unit is controlled by an NMOS transistor MN11 serially connected to the RC circuit. The NMOS transistor MN11 is turned on in response to the first control signal EN1. The capacitor C1 shifts two poles, and the resistor R1 inserts zero. The first compensating unit has an RC value at which a sufficient phase margin and a gain margin can be ensured when the semiconductor memory device is in the normal mode.

The second comparing unit includes an RC circuit connected in parallel to the first compensating unit and includes an RC circuit between the input terminal (gate) and the output terminal (drain) of the PMOS transistor MP3. The RC circuit includes a resistor R2 and a capacitor C2. The operation of the second compensating unit is controlled by an NMOS transistor MN12 serially connected to the RC circuit. The NMOS transistor MN12 is turned on in response to the second control signal EN2. The capacitor C2 shifts two poles, and the resistor R2 inserts zero. The second compensating unit has an RC value at which a sufficient phase margin and a gain margin can be ensured when the semiconductor memory device is in the low power mode.

In addition, the bandgap reference generating circuit further includes a second control switching unit for controlling a current source of the amplifying unit.

The second control switching unit includes NMOS transistors MN7 and MN8 which are serially connected between the node C of the comparing unit and the ground voltage terminal, and is controlled by the first control signal EN1. The first control signal EN1 is applied during the normal mode where the semiconductor memory device performs the data read/write operations.

More specifically, the NMOS transistor MN7 has a drain connected to the node C, a source connected to a drain of the NMOS transistor MN8, and a gate receiving the external control signal EN1. The NMOS transistor MN8 has a source connected to the ground voltage terminal and a gate receiving the bias voltage BIAS.

In addition, the second control switching unit includes another transistor controlled by the second control signal EN2. That is, NMOS transistors MN9 and MN10 are serially connected between the node C of the comparing unit and the ground voltage terminal, with NMOS transistor MN9 controlled by the second control signal EN2. The second control signal EN2 is applied during the self refresh mode or the low power mode.

The NMOS transistor MN9 has a drain connected to the node C, a source connected to a drain of the NMOS transistor MN10, and a gate receiving the external control signal EN2. The NMOS transistor MN10 has a source connected to the ground voltage terminal and a gate receiving the bias voltage BIAS.

The bias voltage BIAS applied to the gates of the NMOS transistors MN8 and MN10 of the second control switching unit is provided as an enable signal when the operation of the comparing unit is enabled, and a disable signal when the operation of the comparing unit is stopped.

An operation of the bandgap reference generating circuit in accordance with the above embodiment of the present invention will be described below.

In order to operate the bandgap reference generating circuit having the two-stage amplifier structure, it is determined whether to perform the control operation by the first control signal EN1 or the second control signal EN2 according to the current operation mode.

In the normal mode (a state where power is sufficiently supplied), the first control signal EN1 is applied. Therefore, the first compensating unit for ensuring a phase margin and a gain margin in order to ensue a negative feedback characteristic is selectively operated by the first control signal EN1.

When a high signal is applied to the gate of the NMOS transistor MN11 controlling the first compensating unit, the NMOS transistor MN11 is turned on. Therefore, a feedback loop passing through the NMOS transistor MN11, the resistor R1 and the capacitor C1 is formed between the input terminal and the output terminal of the amplifying element MP3. During to this operation, the operation of the second compensating unit is interrupted, while the first compensating unit operates. Thus, the first compensating unit is connected between the gate and the drain of the PMOS transistor MP3 of the amplifying unit. That is, the first compensating unit is connected between the input terminal and the output terminal of the amplifying unit.

Meanwhile, in the normal mode, the first control signal EN1 is applied and the current source of the comparing unit is selected by the first control signal EN1.

That is, when the first control signal EN1 is in an activated state, a high signal is applied to the gate of the NMOS transistor MN3, and a low signal, via second control signal EN2, is applied to the gate of the NMOS transistor MN5 that is operated by the second control signal EN2. When a high signal is applied to the NMOS transistor MN3, the NMOS transistor MN3 is turned on. A current path is formed from the node D to the ground voltage via the NMOS transistors MN3 and MN4 by the NMOS transistor MN4 turned on by the bias voltage applied for the operation of the comparing unit. At this point, the NMOS transistor MN5 receiving the low signal is turned off, the current path through the NMOS transistors MN5 and MN6 is blocked even though the NMOS transistor MN6 is turned on. Therefore, the current path of the comparing unit is formed by the NMOS transistors MN3 and MN4 in the normal mode.

The turn-on characteristic of the NMOS transistors MN3 and MN4 selected as the current source of the comparing unit in the normal mode should be higher than that of the NMOS transistors MN5 and MN6 operating at the low power mode. Since an amount of current flowing through the OP amp OP1 in the normal mode is larger than in the low power mode, the turn-on characteristic of the current source determining the output characteristic of the comparing unit in the normal mode becomes larger than the turn-on characteristic of the current source determining the output characteristic of the comparing unit in the low power mode. Therefore, in order for the normal operation of the OP amp OP1, the turn-on characteristic of the NMOS transistors MN3 and MN4 is set to be relatively larger than the turn-on characteristic of the NMOS transistors MN5 and MN6.

In the normal mode, the first control signal EN1 is supplied and the current source of the amplifying unit is selected by the first control signal EN1.

That is, when the first control signal EN1 is activated, a high signal is applied to the gate of the NMOS transistor MN7 and a low signal is applied to the gate of the NMOS transistor MN9 operating in response to the second control signal EN2. When the high signal is applied to the NMOS transistor MN7, the NMOS transistor MN7 is turned on and the current path is formed from the node C to the ground voltage via the NMOS transistors MN8 and MN7 by the NMOS transistor MN8 turned on by the bias voltage applied for the operation of the comparing unit. At this point, the NMOS transistor MN9 receiving the low signal is turned off, the current path through the NMOS transistors MN9 and MN10 is blocked even though the NMOS transistor MN10 is turned on. Therefore, the current path of the comparing unit includes the NMOS transistors MN7 and MN8 in the normal mode.

The turn-on characteristic of the NMOS transistors MN7 and MN8 selected as the current source of the amplifying unit in the normal mode should be higher than that of the NMOS transistors MN9 and MN10 operating at the low power mode. Since an amount of current flowing through the OP amp OP1 in the normal mode is larger than in the low power mode, the turn-on characteristic of the current source determining the output characteristic of the amplifying unit in the normal mode becomes larger than the turn-on characteristic of the current source determining the output characteristic of the amplifying unit in the low power mode. Therefore, in order for the normal operation of the OP amp OP1, the turn-on characteristic of the NMOS transistors MN7 and MN8 is set to be relatively larger than the turn-on characteristic of the NMOS transistors MN9 and MN10.

In the normal mode, the first control signal EN1 is activated, and the current source of the comparing unit, the current source of the amplifying source, and the compensating unit of the amplifying unit are controlled by the first control signal EN1.

Therefore, in the above-described control state, the first and second input signals input to the two NMOS transistors MN1 and MN2 of the comparing unit are differentially amplified, and an initially amplified signal is applied to the node B. The signal of the node B is applied to the PMOS transistor MP3 performing a secondary amplification, and the internal reference voltage is generated through the node C by the amplification operation of the PMOS transistor MP3.

By controlling the current source of the amplifier in the above manner, the bandwidth is increased and the internal reference voltage necessary in the normal mode of the memory device with the improved PSRR is generated.

Meanwhile, when the current source of the amplifier is controlled by the first control signal EN1, that is, the bandwidth is increased, there occurs a problem in the stability of the feedback loop of the amplifying element MP3. To solve this problem, the stability of the feedback loop is improved by inserting the RC compensating unit into the feedback loop of the amplifying element MP3, in which the RC compensating unit is implemented with the resistor and the capacitor. The value of the RC compensating unit will be set to a value readily determined by one of skill in the art, which can improve the stability according to the bandwidth set value. The value of the RC compensating unit is determined by the position of the pole of the OP amp OP1, and the value in the low power mode is relatively larger than that in the normal mode.

In the self refresh mode or the low power mode, the current consumption of the OP amp OP1 should be reduced. In this mode, the comparing unit, the amplifying unit, and the compensating unit are controlled by the second control signal EN2.

This operation procedure is opposite to the above-described operation procedure. That is, the current source of the comparing unit is determined by the NMOS transistors MN5 and MN6, and the current source of the amplifying unit is determined by the NMOS transistors MN9 and MN10. Likewise, the compensating unit provided between the input terminal and the output terminal of the PMOS transistor MP3 serving as the amplifying element is configured with the RC compensating unit including the resistor R2 and the capacitor C2. In this case, the compensating operation of the resistor R2 and the capacitor C2 is performed by the NMOS transistor MN12 which is turned on in response to the second control signal EN2.

In this case, the operating current of the OP amp OP1 should be minimized in order to satisfy the low power operation mode. Therefore, the channel widths of the NMOS transistors MN5 and MN6 and the NMOS transistors MN9 and MN10 determining the current sources of the comparing unit and the amplifying unit are designed to be relatively smaller than in the normal mode.

In particular, the compensating unit solves the stability problem occurring in the operation of the OP amp OP1 when the bandwidth is adjusted by controlling the current source of the OP amp OP1. Therefore, the RC compensating unit is set to the resistance and the capacitance suitable for the low power mode.

Typically, since the two-stage amplifier is a 2-pole system, a phase margin of more than 60 degrees should be ensured for frequency stability. A representative method for ensuring the phase margin of the multi-pole system is a Miller compensation which improves stability by connecting a capacitor between the input and the output of the amplifying element MP3 of the two-stage amplifier and splitting two dominant poles. However, since a feedforward path is formed by the capacitor, an RC serial circuit is connected in order to eliminate the feedforward path. In addition, a resistive element is added between the node B and the output node C to form a zero at the capacitor of the output terminal and the 2-pole position, thereby improving the phase margin due to an offset effect.

In accordance with the embodiments of the present invention, the bandgap reference generating circuit controls the operating current of the amp according to whether is it in the normal mode or the low power mode. To this end, the gain of the amp is changed by controlling the current source of the amp with different values in the normal mode and the low power mode. Therefore, the bandwidth of the amp is controlled while changing the gain of the amp in the normal mode, such that the power noise can be effectively eliminated. Furthermore, the current of the amp in the low power mode is controlled to be small, thereby minimizing the current consumption.

The above-described embodiments are merely for illustrative purposes, and the present invention can also be applied to a case of generating a stable internal reference voltage while satisfying a low power consumption. Therefore, it will be apparent to those skilled in the art that various changes and modifications may be made without departing from the spirit and scope of the invention as defined in the following claims.

Examples of the current control method include a variable control method using a switch in a current mirror or a current bias, and an amp bias voltage control method. The current mirror method has been proposed in the above embodiments, but the present invention is not limited thereto. That is, the gain of the amp is controlled by controlling the current of the amp.

In controlling the gain of the amp, it is possible to control the size of the input transistors of the first and second input signal terminals. In this case, in order to control the size of the input transistors (MN1 and MN2 in the current embodiment) of the first and second input signal terminals, a plurality of input transistors having different channel widths are provided. By connecting the switch to the gate of the transistor, the selective control of the input transistor is possible by the operation control of the switch. When the input transistor is an NMOS transistor, an unused transistor is connected to the ground node, and the transistor to be used is connected to the input terminal node of the amp.

In addition, the compensating unit is divided into two parts in the above embodiments, but the present invention is not limited thereto. The compensating unit may be further subdivided. By further subdividing the structure of the compensating unit, the compensation can be achieved more finely.

Likewise, the first control switching unit and the second control switching unit are controlled in the operation mode and the low power mode, but the present invention is not limited thereto. The operation period may be further subdivided. By further subdividing the structure of the first and second control switching units, the operation control can be achieved more finely.

What is claimed is:

1. A bandgap reference generating circuit comprising:
an operational amplifier configured to generate a bandgap reference voltage; and
a gain controller configured to control a gain of the operational amplifier to have different values in a normal mode and a low power mode, respectively,
wherein the operational amplifier comprises:
a comparator configured to differentially compare first and second input voltages; and
an amplifier configured to generate a reference voltage in response to an output signal of the comparator,
wherein the gain controller includes a first control switching unit configured to control a current of the comparator to have different values in the normal mode and the low power mode, respectively, and
wherein the first control switching unit comprises:
a first MOS transistor configured to switch on the current of the comparator in the normal mode; and
a second MOS transistor configured to switch on the current of the comparator in the low power mode, wherein the first MOS transistor has a larger channel width than the second MOS transistor.

2. The bandgap reference generating circuit as recited in claim 1, wherein the first control switching unit further comprises a biasing current source configured to control an operation of the comparator.

3. A bandgap reference generating circuit comprising:
an operational amplifier configured to generate a bandgap reference voltage; and a gain controller configured to control a gain of the operational amplifier to have different values in a normal mode and a low power mode, respectively, wherein the operational amplifier comprises:
a comparator configured to differentially compare first and second input voltages; and
an amplifier configured to generate a reference voltage in response to an output signal of the comparator, wherein the gain controller includes a second control switching unit configured to control a current of the amplifier to have different values in the normal mode and the low power mode, respectively, and wherein the second control switching unit comprises:
a first MOS transistor configured to switch on the current of the amplifier in the normal mode; and
a second MOS transistor configured to switch on the current of the amplifier in the low power mode, wherein the first MOS transistor has a larger channel width than the second MOS transistor.

4. The bandgap reference generating circuit as recited in claim 3, wherein the second control switching unit further comprises a biasing current source configured to control an operation of the amplifier.

5. A bandgap reference generating circuit, comprising:
an operational amplifier configured to generate a bandgap reference voltage;
a gain controller configured to control a gain of the operational amplifier to have different values in a normal mode and a low power mode, respectively; and
a compensator configured to compensate a feedback voltage of the operational amplifier by different factors in the normal mode and the low power mode, respectively.

6. The bandgap reference generating circuit as recited in claim 5, wherein the compensator comprises:
a first compensating unit connected between an output terminal and an input terminal of an amplifying stage of the operational amplifier, and enabled in the normal mode; and
a second compensating unit connected between the input terminal and the output terminal of the amplifying stage of the operational amplifier, and enabled in the low power mode, each of the first and second compensating units being enabled on for compensating the feedback voltage by a respective switch of the compensating unit.

7. The bandgap reference generating circuit as recited in claim 6, wherein each of the first and second compensating units comprises an RC compensating unit with a resistor and a capacitor.

8. The bandgap reference generating circuit as recited in claim 6, wherein the first and second compensating units are controlled oppositely by control signals generated for a self refresh mode.

9. The bandgap reference generating circuit as recited in claim 5, wherein the gain controller controls the gain by controlling a current source of the operational amplifier.

10. The bandgap reference generating circuit as recited in claim 5, wherein the gain controller controls the gain by selecting a MOS transistor with a different channel size in the normal mode than in the low power mode, wherein the MOS transistor is configured to provide a bias current to the operational amplifier.

11. The bandgap reference generating circuit as recited in claim 5, wherein the low power mode is a self refresh mode.

12. The bandgap reference generating circuit as recited in claim 5, wherein the normal mode is a period when a data read/write operation is performed in a memory device.

13. The bandgap reference generating circuit as recited in claim 7, wherein each of the first and second compensating units includes a switch coupled between the input terminal of the amplifying stage of the operational amplifier and the respective resistor and capacitor of the compensating unit.

14. The bandgap reference generating circuit as recited in claim 6, wherein the amplifying stage is a second amplifying stage of the operational amplifier, the operational amplifier includes a first amplifying stage, and an output of the first amplifying stage is amplified by the second amplifying stage.

15. The bandgap reference generating circuit as recited in claim 5, wherein the operational amplifier comprises:
a comparator configured to differentially compare first and second input voltages; and
an amplifier configured to generate a reference voltage in response to an output signal of the comparator,
wherein the gain controller includes a first control switching unit configured to control a current of the comparator to have different values in the normal mode and the low power mode, respectively, and
wherein the first control switching unit comprises:
a first MOS transistor configured to switch on the current of the comparator in the normal mode; and
a second MOS transistor configured to switch on the current of the comparator in the low power mode, wherein the first MOS transistor has a larger channel width than the second MOS transistor.

16. The bandgap reference generating circuit as recited in claim 5, wherein the operational amplifier comprises:
wherein the operational amplifier comprises:
a comparator configured to differentially compare first and second input voltages; and
an amplifier configured to generate a reference voltage in response to an output signal of the comparator,
wherein the gain controller includes a second control switching unit configured to control a current of the amplifier to have different values in the normal mode and the low power mode, respectively, and
wherein the second control switching unit comprises:
a first MOS transistor configured to switch on the current of the amplifier in the normal mode; and
a second MOS transistor configured to switch on the current of the amplifier in the low power mode, wherein the first MOS transistor has a larger channel width than the second MOS transistor.

* * * * *